Dec. 8, 1959 J. ENSINK ET AL 2,916,565
DEGENERATIVE FEEDBACK TRANSISTOR AMPLIFIER
Filed June 1, 1954
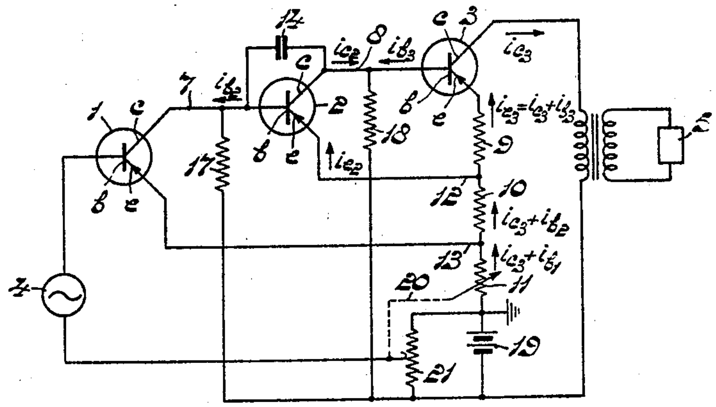
INVENTOR
JOHANNES ENSINK
JAN VERHAGEN United States Patent Office 2,916,565

Patented Dec. 8, 1959

2,916,565

DEGENERATIVE FEEDBACK TRANSISTOR AMPLIFIER

Johannes Ensink and Jan Verhagen, Hilversum, Netherlands, assignors, by mesne assignments, to North American Philips Company, Inc., New York, N.Y., a corporation of Delaware Application June 1, 1954, Serial No. 433,758

Claims priority, application Netherlands June 1, 1953

2 Claims. (Cl. 179—171)

This invention relates to transistor amplifiers comprising a cascade of an odd number of transistors having base signal injection.

The main object of the invention is to provide an extremely stable amplifier of this kind which exhibits very little distortion.

In accordance with the invention, the collector electrodes of each of the preceding transistors of the cascade are coupled, by way of a circuit allowing passage of direct current, to the base electrodes of subsequent transistors, and the emitter circuit of the last transistor of the cascade includes a negative feedback impedance which allows passage of direct current, and which has successive taps connected respectively to the emitter electrodes of the other transistors by way of circuits passing direct current.

In order that the invention may be readily carried into effect, it will now be described with reference to the accompanying drawing, in which the single figure is a schematic diagram of a preferred embodiment of an amplifier of the present invention.

In the figure, the reference numerals 1, 2 and 3 indicate three transistors having base signal injection which are connected in cascade, so that the input signals of a source 4 develop amplified signals at an output impedance 5. The term "base injection" is to be understood here to mean that the oscillation or signal which is to be amplified by a transistor is supplied to its base electrode *b*.

According to the invention, the collector electrodes *c* of preceding transistors of the cascade are connected by way of circuits 7 and 8 which allow passage of direct current to the base electrodes *b* of subsequent transistors, while the circuit of the emitter electrode *e* of the last transistor 3 of the cascade includes a negative feedback impedance 9, 10, 11, which allows passage of direct current and which has taps 12 and 13 connected to the various emitter electrodes *c* of the preceding transistors 2 and 1, respectively, to provide degenerative feedback. The direct-current signal couplings and the degenerative feedback reduce the amount of phase shift of the signal in the amplifier.

Due to this method of connection, whereby undesirable phase shifts are avoided as far as possible, the tendency to self-oscillation is reduced, which tendency may be reduced still further by the provision of a phase-correcting network, for example, a comparatively small capacitor 14, connected between the collector electrode and the base electrode of transistor 2. Furthermore, it is found that the arrangement may exhibit great freedom from distortion since the current which flows through portion 11 of the impedance and which substantially determines the degree of degeneration or negative feedback of the arrangement, is substantially equal to the collector current $i_{c3}$ of transistor 3, so that this current and hence the current flowing through output impedance 5, is highly linearized by the feedback.

In order to realize this, one may consider that portion 9 of the impedance is traversed by the emitter current $i_{e3}$ of transistor 3, which is equal to the sum $i_{c3}+i_{b3}$ of the base current and the collector current of transistor 3. Said currents are all to be understood as current variations from the working point of the transistors. Portion 10 of the impedance is now traversed by a current $i_{e3}+i_{e2}$, but assuming that the impedances 17 and 18, by which the circuits 7 and 8 are connected to a source of supply 19, have high values with respect to the input impedances of the transistors, the collector current $i_{c2}$ of transistor 2 is equal and opposite to the current $i_{b3}$, and since furthermore there applies in a similar manner $i_{e2}=i_{c2}+i_{b2}$, there follows for the current through portion 10 of the impedance $i_{e3}+i_{e2}=i_{e3}+i_{b2}-i_{b3}=i_{c3}+i_{b2}$. Similarly it is found that portion 11 of the impedance is traversed by a current $i_{c3}+i_{b1}$ and since $i_{b1}$ is many times smaller than $i_{c3}$, this current may be assumed to be substantially equal to $i_{c3}$.

It will be evident from the foregoing that, in order to obtain this freedom from distortion, not only the impedances 17 and 18 must be comparatively high, but also the impedance between the lower side of the source supply 19 and the point 12 or 13, respectively, must be infinite, or at least be given a comparatively high value.

In order to permit adjustment of the negative feedback, the portion 11 of the impedance may be made variable. However, in this case the bias of the base electrode *b* of transistor 1, which is provided by way of a potentiometer 21, is preferably also varied by means of a mechanical coupling 20, in order that the adjustment of transistor 1 may be maintained substantially constant.

Although the impedances 9, 10 and 11 are shown as resistors, it will be evident that, for example, for producing a feedback which is variable with frequency, they may be replaced by suitably proportioned impedances, for example, by shunting the resistors shown by impedances which do not affect the D.C.-adjustment. Furthermore, impedances passing direct current may be included in the circuits 7 and 8, or in the emitter circuits of the transistors 1 and 2, respectively.

In one advantageous embodiment of the amplifier of the invention, use was made of three transistors of the PNP-type, by which 30 db amplification and 20 db negative feedback could be obtained; without the capacitor 14 (4,000 micromicrofarads) the negative feedback must be limited to about 15 db. The resistors 9 and 10 each had a value of 45 ohms and the resistors 17 and 18 had values of 60 and 12 kilohms, respectively.

While a preferred embodiment of the invention has been shown and described, still other embodiments will be apparent to those skilled in the art which will fall within the scope of the invention as defined in the following claims.

What is claimed is:

1. A cascade degenerative feedback transistor signal amplifier comprising three transistors and a single source of operating potential, a source of signals connected to the base electrode of a first one of said transistors, a first signal carrying direct-current electrical connection between the collector electrode of said first transistor and the base electrode of a second one of said transistors, a second signal carrying direct-current electrical connection between the collector electrode of said second transistor and the base electrode of the third one of said transistors, a signal output circuit connected to the collector electrode of said third transistor, a signal impedance circuit connected between a terminal of said source of operating potential and the emitter electrode of said third transistor, the remaining terminal of said source of operating potential being connected to provide operating current to the collector electrode of said third transistor, load resistors connected between said source of operating potential and said first and second direct-current connections, respectively, a first tap on said impedance circuit connected to the emitter electrode of said first transistor, and a second tap on said impedance circuit connected to the emitter electrode of said second transistor, said second tap being relatively closer to the emitter electrode of said third transistor than said first tap.

2. A cascade degenerative feedback transistor signal amplifier comprising three transistors and a single source of operating potential, a source of signals connected to the base electrode of a first one of said transistors, a first signal carrying direct-current electrical connection between the collector electrode of said first transistor and the base electrode of a second one of said transistors, a second signal carrying direct-current electrical connection between the collector electrode of said second transistor and the base electrode of the third one of said transistors, a signal output circuit connected to the collector electrode of said third transistor, a signal impedance circuit connected between a terminal of said source of operating potential and the emitter electrode of said third transistor, the remaining terminal of said source of operating potential being connected to provide operating current to the collector electrode of said third transistor, biasing connections between said source of operating potential and said first and second direct-current connections, respectively, a first tap on said impedance circuit connected to the emitter electrode of said first transistor, a second tap on said impedance circuit connected to the emitter electrode of said second transistor, means connected to supply a variable bias voltage to the base electrode of said first transistor, and means connected to vary simultaneously said bias voltage and the impedance of the part of said impedance circuit immediately adjacent said source of operating potential.

References Cited in the file of this patent

UNITED STATES PATENTS

| | | |
|---|---|---|
| 2,032,193 | White | Feb. 25, 1936 |
| 2,149,361 | Reth | Mar. 7, 1939 |
| 2,598,326 | White et al. | May 27, 1952 |
| 2,657,282 | Winkel | Oct. 27, 1953 |
| 2,663,806 | Darlington | Dec. 22, 1953 |
| 2,746,016 | Schurr | May 15, 1956 |

OTHER REFERENCES

Text, "The Transistor," pages 185, 186, pub. 1951 by Bell Tel. Labs., Murray Hill, N.J.

Shea text: "Principles of Transistor Circuits," pages 349–351, pub. 1953 by John Wiley & Sons, N.Y.

Langford and Smith: "Radiotron Designer's Handbook," Fourth edition, 1952, page 329.